(12) United States Patent
Yao et al.

(10) Patent No.: US 10,790,641 B1
(45) Date of Patent: Sep. 29, 2020

(54) CLAMPING MECHANISM FOR DIN RAIL

(71) Applicant: MOXA INC., New Taipei (TW)

(72) Inventors: Min-Heng Yao, New Taipei (TW); Chung-Kun Hou, New Taipei (TW)

(73) Assignee: Moxa Inc., New Taipei (TW)

( * ) Notice: Subject to any disclaimer, the term of this patent is extended or adjusted under 35 U.S.C. 154(b) by 15 days.

(21) Appl. No.: 16/552,050

(22) Filed: Aug. 27, 2019

(51) Int. Cl.
| H05K 7/00 | (2006.01) |
| H02B 1/052 | (2006.01) |
| H05K 7/18 | (2006.01) |

(52) U.S. Cl.
CPC ........... *H02B 1/0523* (2013.01); *H05K 7/183* (2013.01)

(58) Field of Classification Search
None
See application file for complete search history.

(56) References Cited

U.S. PATENT DOCUMENTS

| 6,431,909 | B1 * | 8/2002 | Nolden | H01R 9/2608 |
| | | | | 361/735 |
| 7,073,971 | B2 * | 7/2006 | Schurr | H02B 1/052 |
| | | | | 403/325 |
| 7,317,613 | B2 * | 1/2008 | Quijano | F16M 11/041 |
| | | | | 16/323 |
| 7,674,129 | B1 * | 3/2010 | Liu | H02B 1/052 |
| | | | | 361/807 |
| 10,085,355 | B2 * | 9/2018 | Giefers | G06F 1/181 |
| 10,306,796 | B2 * | 5/2019 | Huang | H05K 13/04 |
| 10,365,696 | B1 * | 7/2019 | Huang | H05K 7/1468 |
| 10,524,369 | B2 * | 12/2019 | Chiu | G06F 1/1607 |
| 2006/0175489 | A1 * | 8/2006 | Portal | H01R 9/2608 |
| | | | | 248/215 |
| 2010/0188812 | A1 * | 7/2010 | Morrison | F16M 11/041 |
| | | | | 361/679.58 |

* cited by examiner

*Primary Examiner* — Courtney L Smith
*Assistant Examiner* — Rashen E Morrison
(74) *Attorney, Agent, or Firm* — Winston Hsu

(57) ABSTRACT

A clamping mechanism for a din rail is provided. No external force is continuously applied to a sliding component to maintain the removal state of the clamping mechanism. The clamping mechanism does not require additional tools for recovery of the sliding component. Therefore, the efficiency of providing the clamping mechanism for easy disassembly and assembly on the din rail may be achieved.

9 Claims, 10 Drawing Sheets

CLAMPING MECHANISM FOR DIN RAIL

BACKGROUND

1. Technical Field

The present invention relates to a clamping mechanism. In particular, the invention pertains to a clamping mechanism for a din rail, wherein no external force is continuously applied to a sliding component to maintain the removal state of the clamping mechanism, and the clamping mechanism does not require additional tools for recovery of the sliding component.

2. Description of Related Arts

In general, a din rail is widely used in a system equipment or various types of chassis. In order to enable various electronic devices, such as storage devices and power supply devices, to be detachably fixed to the din rail, the body of the detachable electronic device has a clamping device to make the detachable electronic device fixed to the din rail with the aid of the clamping device.

In addition to providing the clamping device on the body of the detachable electronic device, the clamping device clamped on the din rail can be designed separately and can be used with different detachable electronic devices, so that the detachable electronic device can be widely applied to the din rail.

The existing clamping device for the din rail is mostly a reciprocating structure, that is, the clamping device for the din rail is fixed to the din rail through the elastic restoring force of an elastic component (that is, the clamping force that makes the clamping device fixed to the din rail). The above design makes the clamping device securely clamp and fixed to the din rail However, the existing reciprocating clamping device for the din rail lacks an effective disassembly positioning design, that is, the user cannot know whether the reciprocating clamping device can be detached from the din rail. When the user needs to disassemble the reciprocating clamping device for the din rail from the din rail, the user needs to use one hand to apply force to overcome the clamping force of the elastic component, and the other hand to disassemble the clamping device since the reciprocating clamping device is clamped to the din rail by the clamping force formed by the elastic component. During the disassembly process, the user cannot visually know whether the reciprocating clamping device can be detached from the din rail, which is very disadvantageous to the user's operation.

In addition, when the force applied against the clamping force of the elastic component is insufficient, the user cannot know whether the clamping device can be detached from the din rail. When the clamping device is forcibly removed from the din rail, the clamping device or the din rail is damaged. These are the problems with existing clamping devices.

In summary, it can be seen that there are problems in the prior art that it is inconvenient to remove the clamping device from the din rail and it is easy to cause damage to the clamping device. Therefore, it is necessary to propose an improved technical solution to solve this problem.

SUMMARY

In view of the prior art, there are problems in the prior art that it is inconvenient to remove the clamping device from the din rail and it is easy to cause damage to the clamping device, and the present invention discloses a clamping mechanism for a din rail.

The clamping mechanism for the din rail disclosed in the present invention is configured to be fixed to the din rail having a first sliding rail and a second sliding rail. The clamping mechanism includes a base, a sliding component, an elastic component and a limit component.

The base has two first fastening portions, a plurality of fixing holes, a group of guiding grooves, a first elastic component fixing portion and a limit component fixing hole.

The sliding component has two second fastening portions, a second guiding groove, a second elastic component fixing portion and an operating portion, and the sliding component is disposed between the group of guiding grooves of the base to make the sliding component slide relative to the base through the group of guiding grooves.

A first end of the elastic component is fixed to the first elastic component fixing portion of the base, and a second end of the elastic component is fixed to the second elastic component fixing portion of the sliding component. The elastic component provides a force for the sliding component to slide upward or downward to cause the clamping mechanism to clamp the din rail or be detached from the din rail through the two first fastening portions of the base and the two second fastening portions of the sliding component.

The limit component is configured to be fixed by passing through the limit component fixing hole of the base and the second guiding groove of the sliding component. The limit component provides a limit on a sliding position where the sliding component slides relative to the base to limit a sliding range of the sliding component by the second guiding groove.

The mechanism disclosed by the present invention is as above, and the differences from the prior art are that no external force is continuously applied to a sliding component to maintain the removal state of the clamping mechanism, and the clamping mechanism does not require additional tools for recovery of the sliding component, so that it is easy to disassemble the clamping mechanism from the din rail or assemble the clamping mechanism to the din rail.

By the aforementioned technology means, the present invention can achieve the technical effect of providing the clamping mechanism for easy disassembly and assembly on the din rail.

BRIEF DESCRIPTION OF THE DRAWINGS

The structure, operating principle and effects of the present invention will be described in detail by way of various embodiments, which are illustrated in the accompanying drawings.

DETAILED DESCRIPTION

Figure 1:
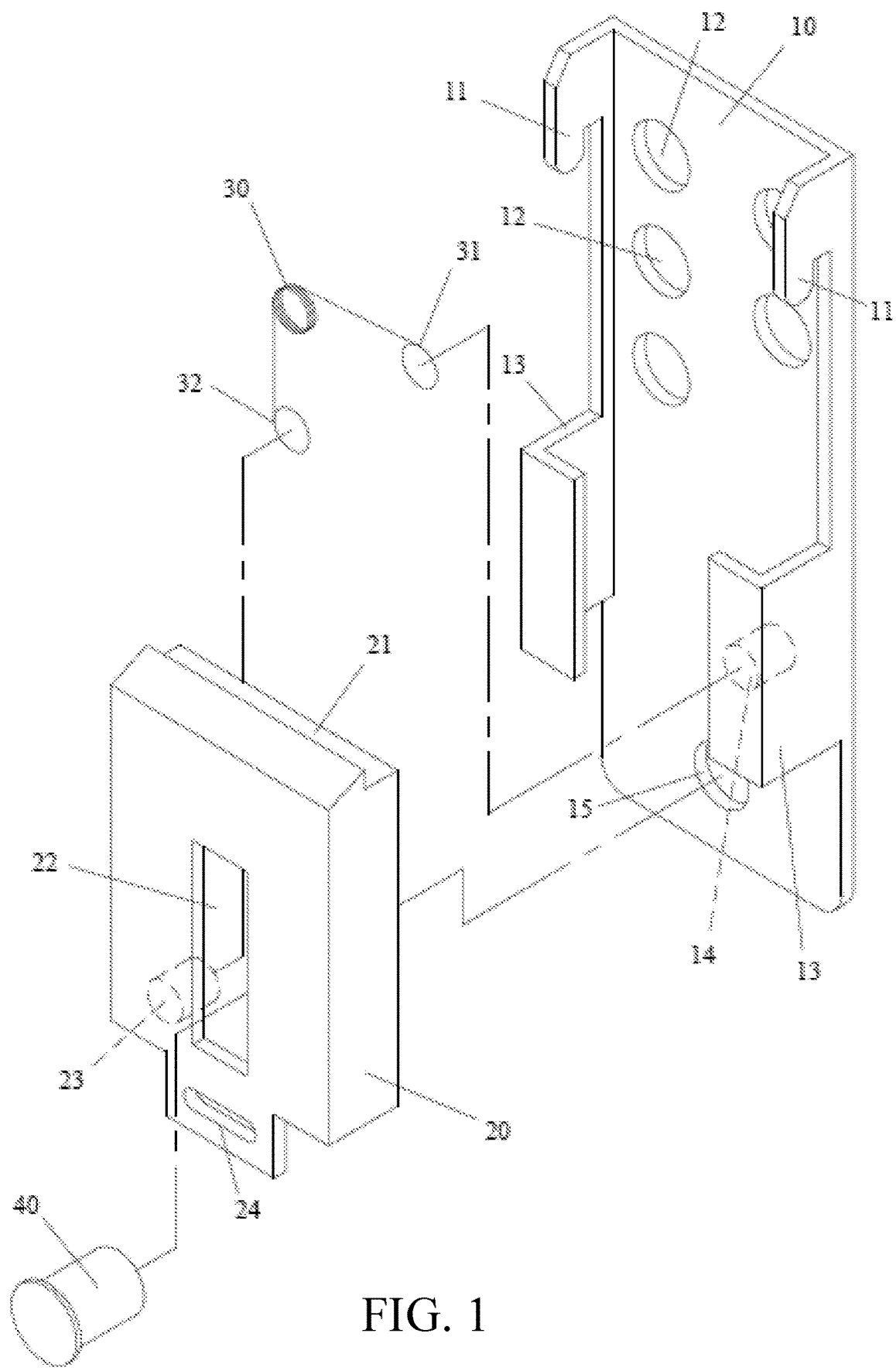
FIG. 1 is an exploded perspective view showing a clamping mechanism for a din rail according to the present invention.

The following embodiments of the present invention are herein described in detail with reference to the accompanying drawings. These drawings show specific examples of the embodiments of the present invention. It is to be understood that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of components in the drawings may be exaggerated or diminished in size for the sake of clarity and convenience. Such arbitrary proportions are only illustrative and not limiting in any way. The same reference numbers are used in the drawings and description to refer to the same or like parts.

As used herein, the term "or" includes any and all combinations of one or more of the associated listed items. It will be understood that when an component is referred to as being "connected to" or "coupled to" another component, it can be directly connected or coupled to the other component, or intervening components may be present. In contrast, when an component is referred to as being "directly connected to" or "directly coupled to" another component, there are no intervening components present.

In addition, unless explicitly described to the contrary, the word "comprise" and variations such as "comprises" or "comprising", will be understood to imply the inclusion of stated components but not the exclusion of any other components.

In the following, a clamping mechanism for a din rail disclosed in the present invention is first described. Please refer to FIG. 1, and the FIG. 1 is an exploded perspective view showing a clamping mechanism for a din rail according to the present invention.

The present invention discloses the clamping mechanism for the din rail. The clamping mechanism comprises a base 10, a sliding component 20, an elastic component 30 and a limit component 40.

The base 10 has two first fastening portions 11, a plurality of fixing holes 12, a group of guiding grooves 13, a first elastic component fixing portion 14, and a limit component fixing hole 15. The two first fastening portions 11 are disposed on the two sides of the top end of the base 10, and are used to make the base hook the first sliding rail of the din rail. The fixing holes 12 are used to make the base fixed to an external device through the screwing manner. It is noted that the fixing holes 12 are not disposed between the group of guiding grooves 13. The group of guiding grooves 13 are disposed on both sides of the bottom end of the base 10. The first elastic component fixing portion 14 is provided for the base 10 to be fixed to the first end 31 of the elastic component 30. The limit component fixing hole 15 is provided for the base 10 to be fixed to the limit component 40 through the screwing manner.

Figure 2A:
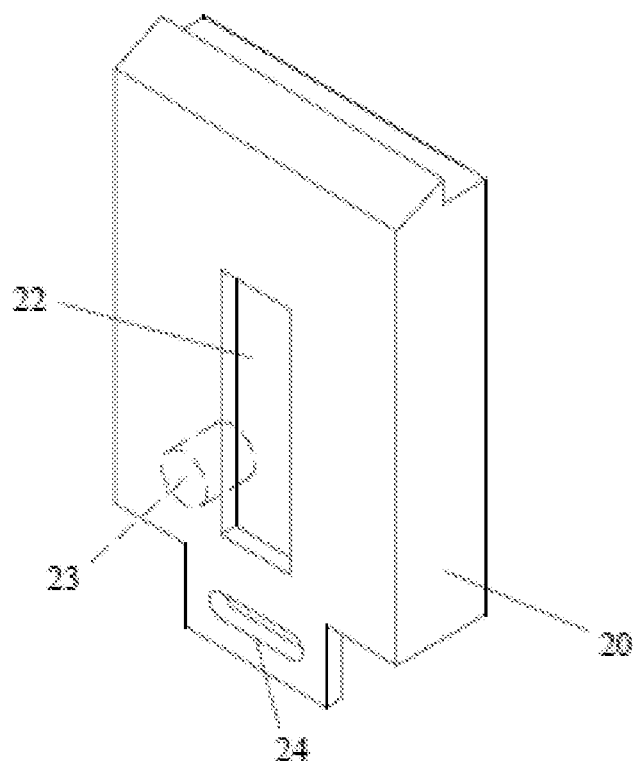
FIG. 2A is a perspective view showing a sliding component of the clamping mechanism for the din rail according to the present invention in a first view angle.

Please refer to FIG. 2A and FID. 2B, wherein FIG. 2A is a perspective view showing a sliding component of the clamping mechanism for the din rail according to the present invention in a first view angle, and FIG. 2A is a perspective view showing a sliding component of the clamping mechanism for the din rail according to the present invention in a first view angle.

The sliding component 20 has two second fastening portions 21, a second guiding groove 22, a second elastic component fixing portion 23, and an operating portion 24. The sliding component 20 is disposed between the group of guiding grooves 13 of the base 10. The sliding component 20 slides relative to the base 10 through the group of guiding grooves 13. The two second fastening portions 21 top hold the second slide rail of the din rail by the force provided by the elastic component 30. That is, the two second fastening portions 21 cooperate with the two first fastening portions 11 to make the clamping mechanism clamp the din rail, and the second guiding groove 22 cooperates with the limit component 40 to provide a limit on a sliding position where the sliding component 20 slides relative to the base 10. The second elastic component fixing portion 23 is for fixing the second end 32 of the elastic component 30 to the sliding component 20. The operating portion 24 is provided with an external force for the sliding of the sliding component 20.

Figure 2B:
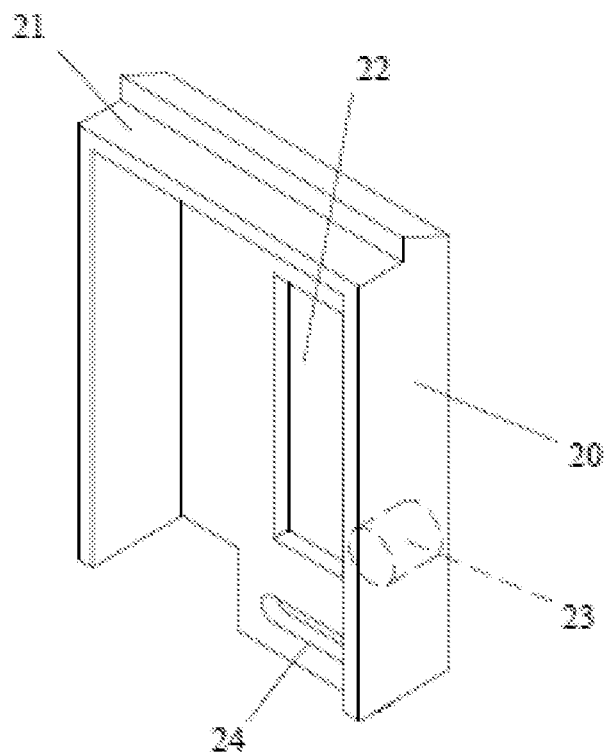
FIG. 2B is a perspective view showing the sliding component of the clamping mechanism for the din rail according to the present invention in a second view angle.
Figure 3:
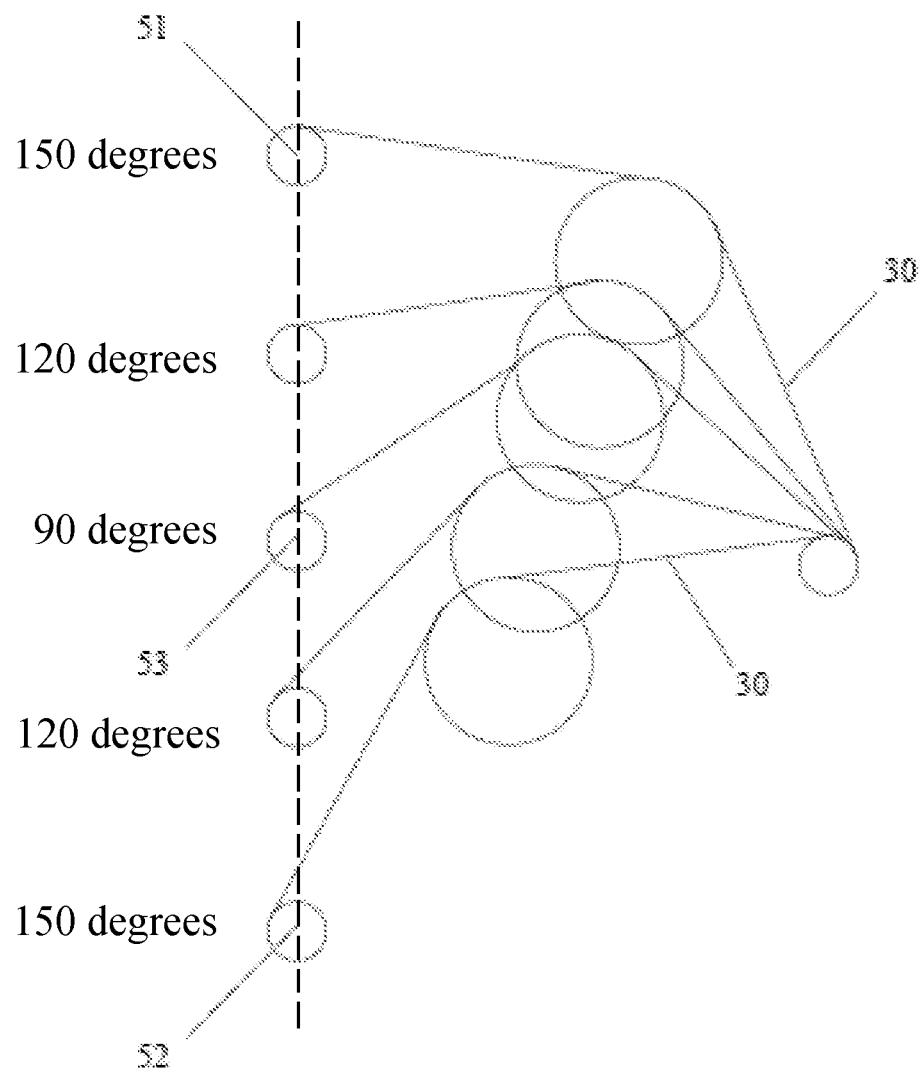
FIG. 3 is a view showing positions and states of an elastic component of the clamping mechanism for the din rail according to the present invention.

Please refer to FIG. 1 and FIG. 3, and FIG. 3 is a view showing positions and states of an elastic component of the clamping mechanism for the din rail according to the present invention. The first end 31 of the elastic component 30 is fixed to the first elastic component fixing portion 14 of the base 10, and the second end 32 of the elastic component 30 is fixed to the second elastic component fixing portion 23 of the sliding component 20 as shown in FIG. 2B. The elastic component 30 is configured to provide the force for the sliding component 20 to slide upward or downward to cause the clamping mechanism to clamp the din rail or be detached from the din rail through the first fastening portion 11 of the base 10 and the second fastening portion 21 of the sliding component 20. It is worth noting that the elastic component 30 is a torsion spring.

It is noted that the sliding top position of the sliding component 20 is the top free position 51 of the free torsion angle of the elastic component 30, and the sliding bottom position of the sliding component 20 is the bottom free position 52 of the free torsion angle of the elastic component 30. The force generated by the elastic component 30 during sliding of the sliding component 20 causes the sliding component 20 to approach the top free position 51 or the bottom free position 52 of the elastic component 30. That is, the force generated by the elastic component 30 between the top free position 51 and the equilibrium position 53 of the sliding component 20 can cause the sliding component 20 to approach the top free position 51 of the elastic component 30. The force generated by the elastic component 30 between the bottom free position 52 and the equilibrium position 53 of the sliding component 20 can cause the sliding component 20 to approach the bottom free position 51 of the elastic component 30, whereby the force generated by the elastic component 30 brings the sliding component 20 closer to the top free position 51 and the bottom free position 52 of the elastic component 30, thereby providing the sliding component 20 with the technical effect of the bidirectional reset (that is, resetting to the sliding top position of the sliding component 20 and the sliding bottom position of the sliding component 20).

The limit component 40 is fixedly screwed by passing through the second guiding groove 22 of the sliding component 20 and the limit component fixing hole 15 of the base 10.

The limit component 40 provides a limit on a sliding position where the sliding component 40 slides relative to the base 10 to limit a sliding range of the sliding component 20 by the second guiding groove 22 of the sliding component 20. That is, the sliding length of the sliding component 20 is the length of the second guide groove 22 of the sliding component 20.

Figure 4:
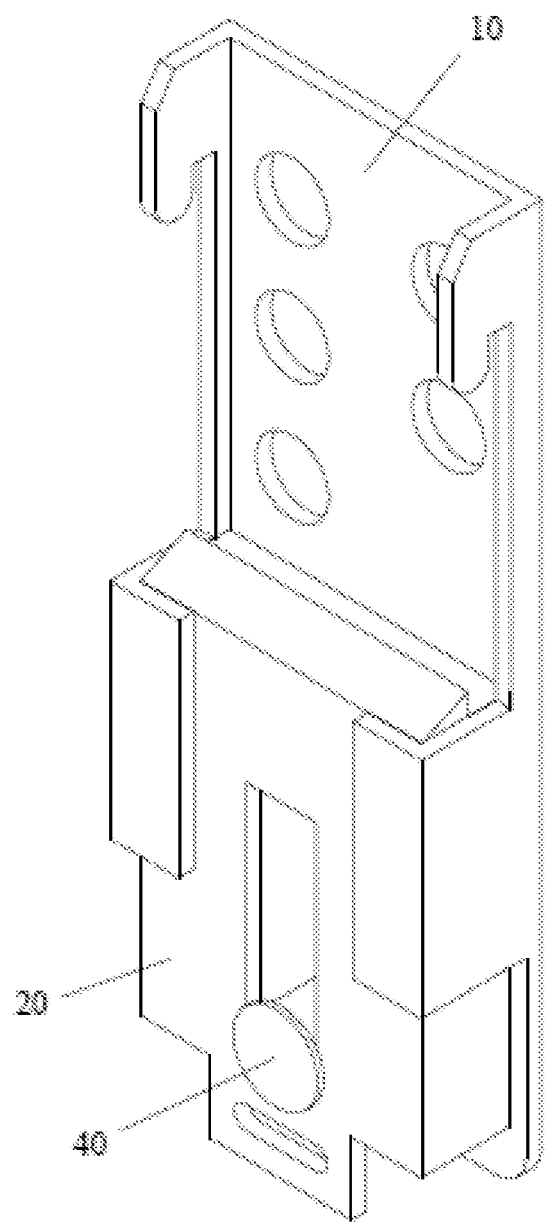
FIG. 4 is an assembled perspective view showing the clamping mechanism for the din rail according to the present invention.

After the base 10, the sliding component 20, the elastic component 30, and the limit component 40 are combined, the clamping mechanism for the din rail of the present invention can be combined. The combined mechanism for the din rail as shown in FIG. 4. FIG. 4 is an assembled perspective view showing the clamping mechanism for the din rail according to the present invention.

Please refer to FIG. 3 and FIG. 5A to FIG. 5C, and FIG. 5A to FIG. 5C are plan views showing the sliding positions of the sliding component of the clamping mechanism for the din rail according to the present invention.

Figure 5A:
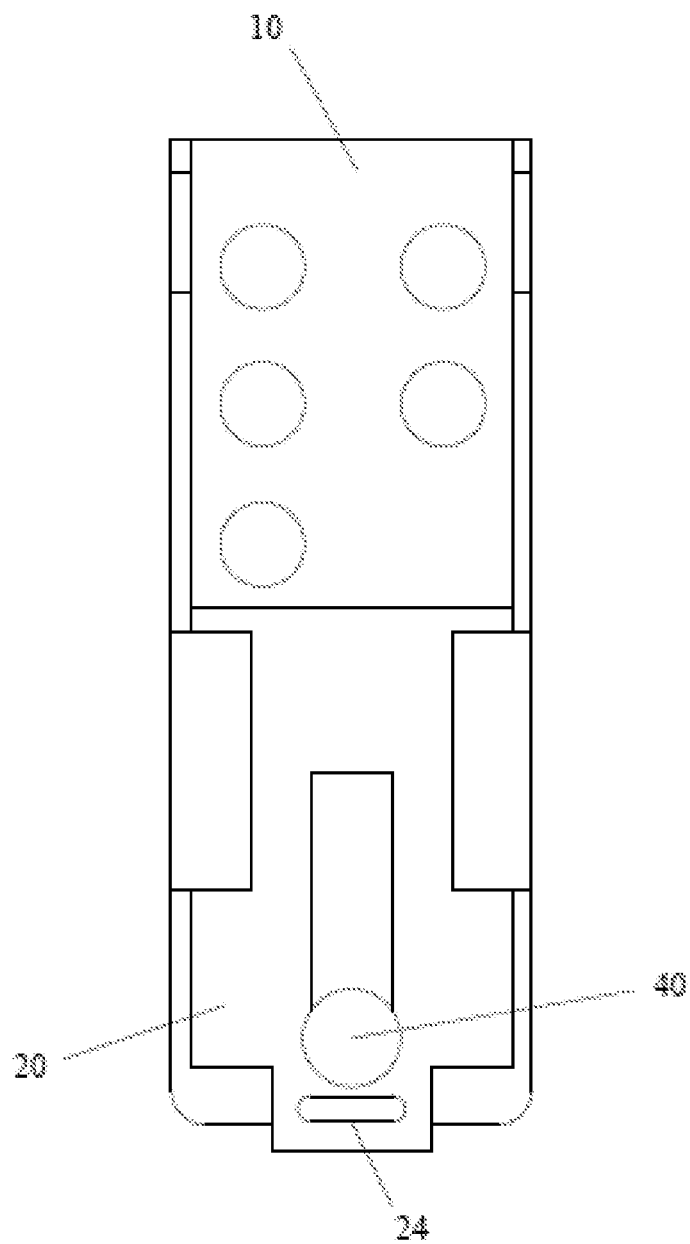
FIG. 5A to FIG. 5E are plan views showing the sliding positions of the sliding component of the clamping mechanism for the din rail according to the present invention.
Figure 5B:
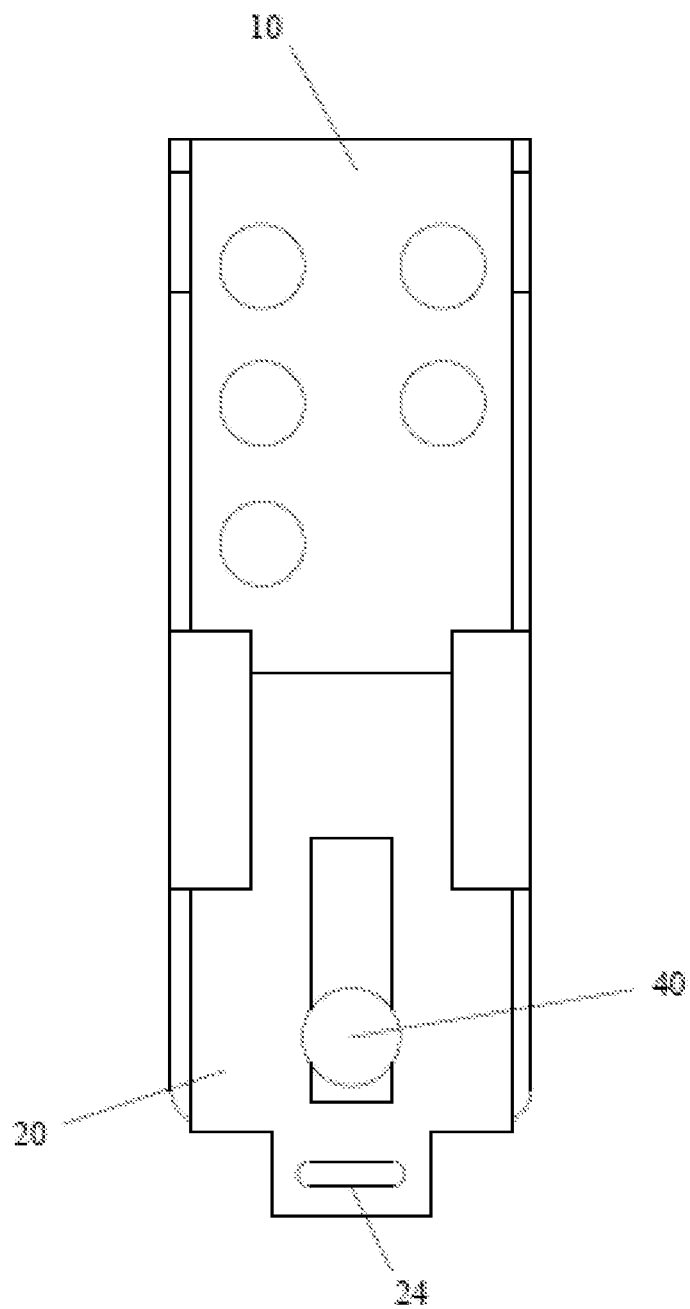
Figure 5C:
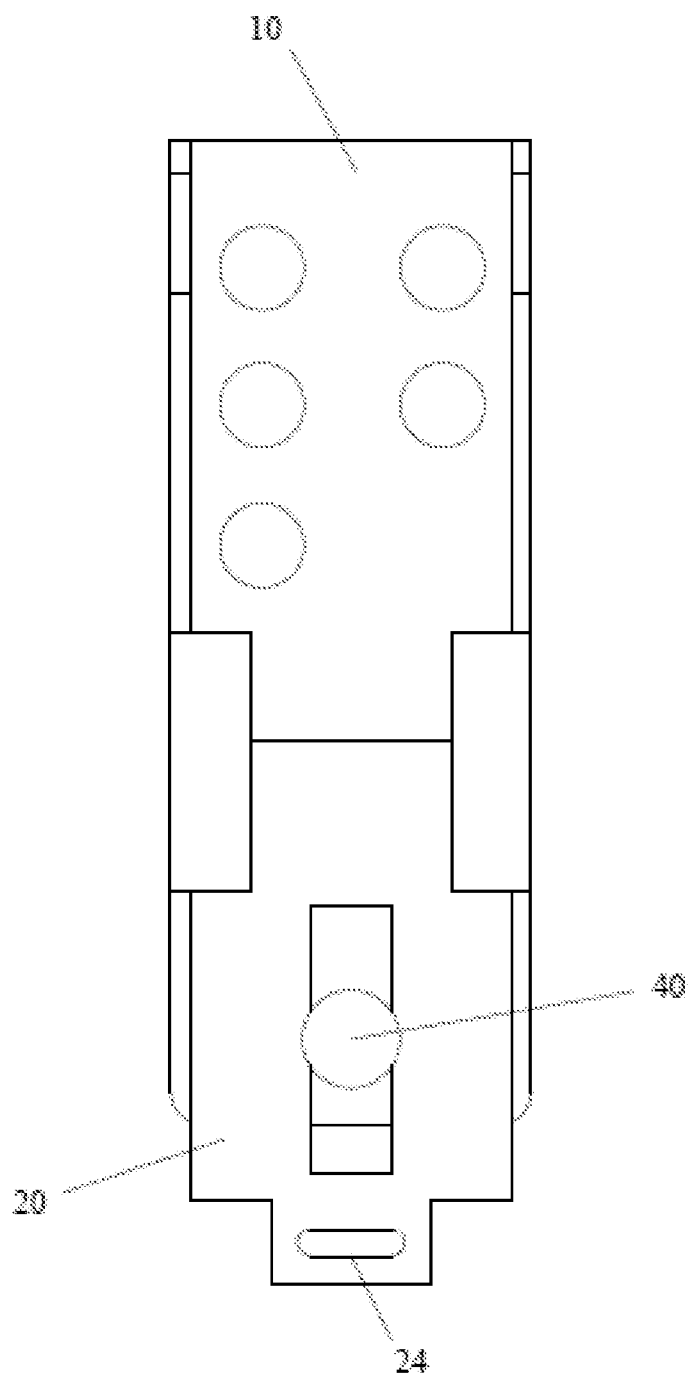

FIG. 5A to FIG. 5C are views showing that an external force is applied to the operating portion 24 to make the sliding component 20 slide downward from the top end of the group of guiding grooves 13 of the base 10 to the position where the first end and the second end of the elastic component present at an angle of 90 degrees. At this time, the elastic component 30 has a restoring force for being near to the top free position 51.

It should be noted that, in FIG. 5A, the first end 31 of the elastic component 30 and the second end 32 of the elastic component 30 are at an angle of 150 degrees, and the elastic component 30 is at the top free position 51; in FIG. 5B, the first end 31 of the elastic component 30 and the second end 32 of the elastic component 30 are at an angle of 120 degrees, and the elastic component 30 has a restoring force for being near to the top free position 51; and in FIG. 5C, the first end 31 of the elastic component 30 and the second end 32 of the elastic component 30 are an angle of 90 degrees, and the elastic component 30 is at the equilibrium position 53.

In FIG. 5A to FIG. 5C, the elastic component 30 converts the torque of the elastic component 30 to continuously provide the upward force of the sliding component 20, and when the external force applied to the operating portion 24 of the sliding component 20 is interrupted, the upward force of the sliding component 20 is continuously provided by the elastic component 30 (that is, the elastic component 30 has a restoring force for being near to the top free position 51) to make the two first fastening portions 11 of the base 10 fasten the first sliding rail of the din rail and make the two second fastening portions 21 of the sliding component 20 top hold the second sliding rail of the din rail, so that the clamping mechanism clamps and is fixed to the din rail.

Please refer to FIG. 3 and FIG. 5C to FIG. 5E, and FIG. 5C to FIG. 5E are plan views showing the sliding positions of the sliding component of the clamping mechanism for the din rail according to the present invention.

When an external force applied to the operating portion 24 of the sliding component 20 causes the sliding component 20 to slide downwards from the top end of the group of guide grooves 13 of the base 10 and the sliding position of the sliding component 20 exceeds that in FIG. 5C, the elastic component 30 has the restoring force for being near to the bottom free position 52. Then, the external force applied to the operating portion 24 of the sliding component 20 can be interrupted, and FIG. 5C to FIG. 5E are views showing that the sliding component 20 slides downwards from the position where the first end and the second end of the elastic component present at an angle of 90 degrees to the bottom end of the group of guiding grooves 13 of the base 10.

Figure 5D:
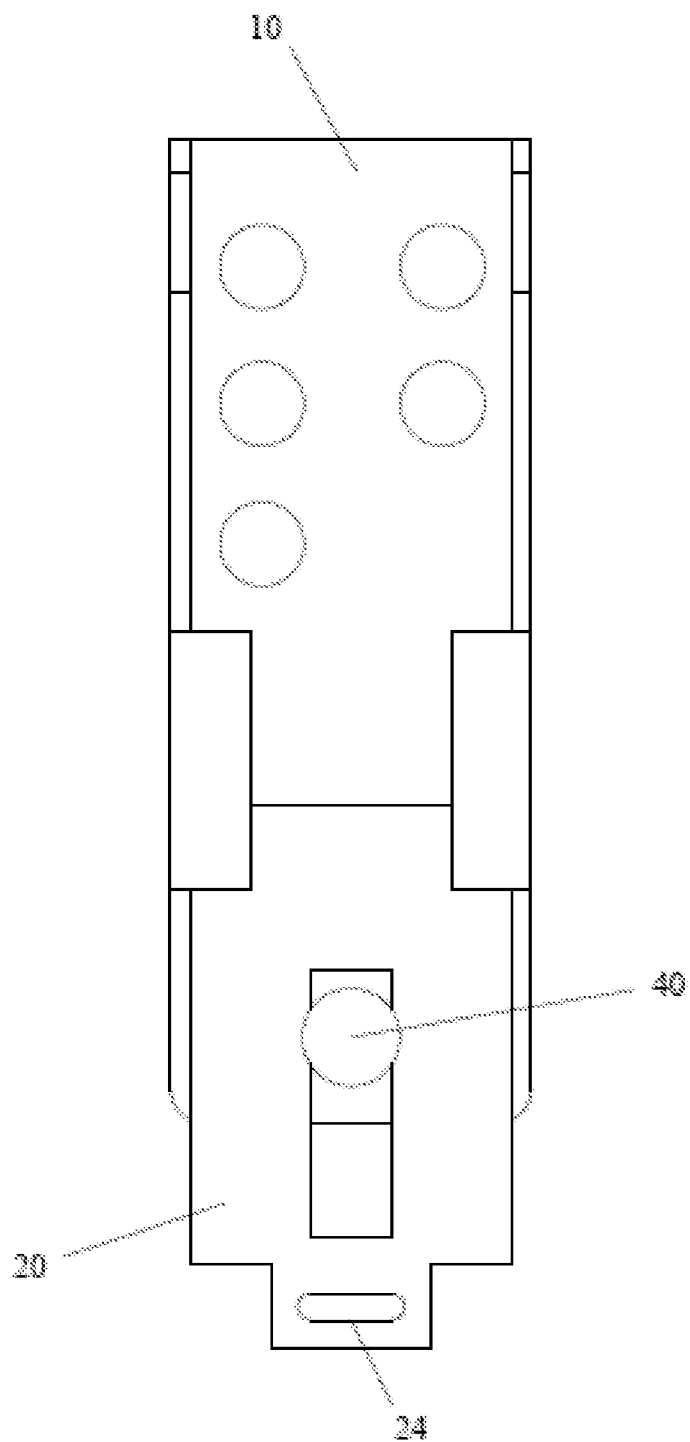
Figure 5E:
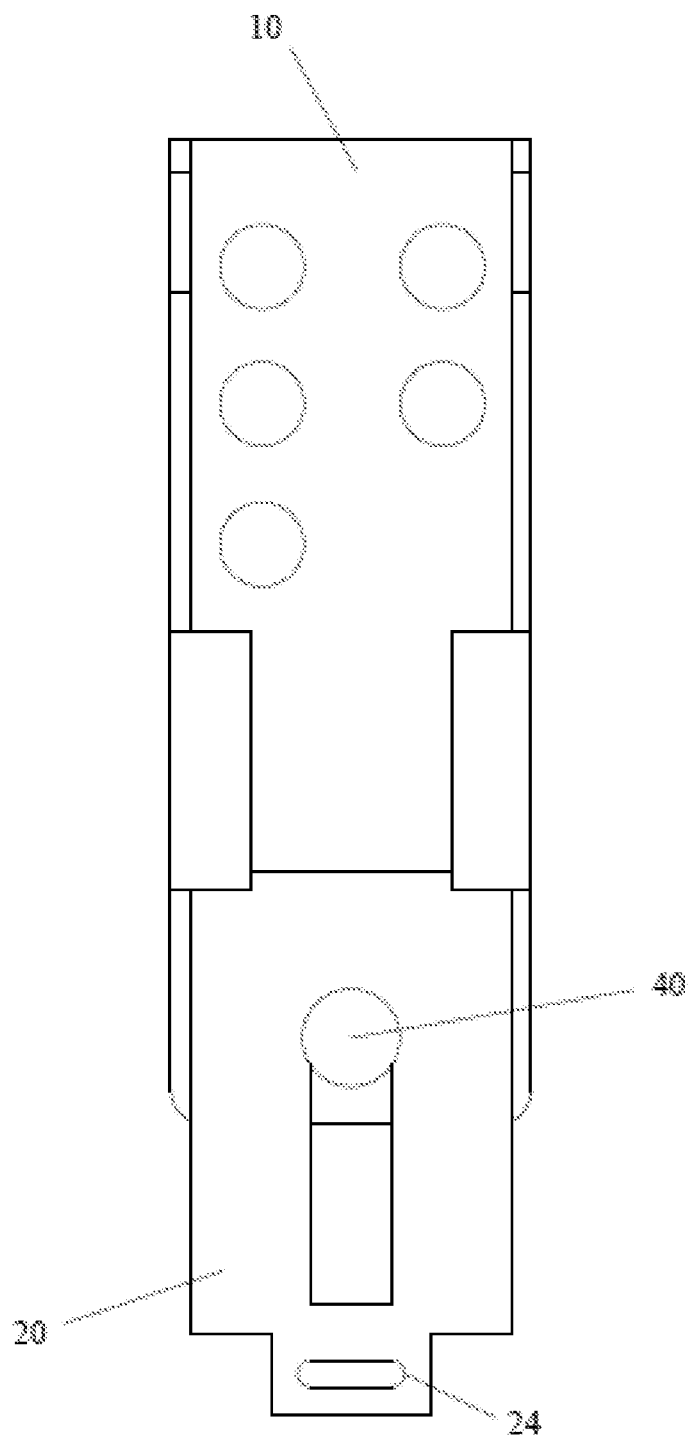

It should be noted that, in FIG. 5C, the first end 31 of the elastic component 30 and the second end 32 of the elastic component 30 are at an angle of 90 degrees, at which time the elastic component 30 is at the equilibrium position 53; in FIG. 5D, the first end 31 of the elastic component 30 and the second end 32 of the elastic component 30 are an angle of 120 degrees, and the elastic component 30 has a restoring force for being near to the bottom free position 52; and in FIG. 5E, the first end 31 of the elastic component 30 and the second end 32 of the elastic component 30 are an angle of 150 degrees, at which time the elastic component 30 is at the bottom free position 52.

In FIG. 5C to FIG. 5E, the elastic component 30 converts the torque of the elastic component 30 to continuously provide the downward force of the sliding component 20, and when the external force applied to the operating portion 24 of the sliding component 20 can be interrupted, the downward force of the sliding component 20 is continuously provided by the elastic component 30 (that is, the elastic component 30 has a restoring force for being near to the bottom free position 52) to make the two first fastening portions 11 of the base 10 and the two second fastening portions 21 of the sliding component 20 disassemble the clamping mechanism from the din rail.

Please refer again to FIG. 3 and FIG. 5E to FIG. 5C. FIG. 5E to FIG. 5C are views showing that an external force is applied to the operating portion 24 to make the sliding component 20 slide upward from the bottom end of the group of guiding grooves 13 of the base 10 to the position where the first end and the second end of the elastic component present at an angle of 90 degrees. At this time, the elastic component 30 has a restoring force for being near to the bottom free position 51.

In FIG. 5E to FIG. 5C, the elastic component 30 converts the torque of the elastic component 30 to continuously provide the downward force of the sliding component 20, and when the external force applied to the operating portion 24 of the sliding component 20 is interrupted, the downward force of the sliding component 20 is continuously provided by the elastic component 30 (that is, the elastic component 30 has a restoring force for being near to the bottom free position 52) to make the two first fastening portions 11 of the base 10 and the two second fastening portions 21 of the sliding component 20 disassemble the clamping mechanism from the din rail.

Please refer again to FIG. 3 and FIG. 5C to FIG. 5A. When an external force applied to the operating portion 24 of the sliding component 20 causes the sliding component 20 to slide upwards from the bottom end of the group of guide grooves 13 of the base 10 and the sliding position of the sliding component 20 exceeds that in FIG. 5C, the elastic component 30 has the restoring force for being near to the top free position 52. Then, the external force applied to the operating portion 24 of the sliding component 20 can be interrupted, and FIG. 5C to FIG. 5A are views showing that the sliding component 20 slides upwards from the position where the first end and the second end of the elastic component present at an angle of 90 degrees to the top end of the group of guiding grooves 13 of the base 10. At this time, the elastic component 30 has a restoring force for being near to the top free position 51.

In FIG. 5C to FIG. 5A, the elastic component 30 converts the torque of the elastic component 30 to continuously provide the upward force of the sliding component 20, and when the external force applied to the operating portion 24 of the sliding component 20 is interrupted, the upward force of the sliding component 20 is continuously provided by the elastic component 30 (that is, the elastic component 30 has a restoring force for being near to the top free position 51) to make the two first fastening portions 11 of the base 10 fasten the first sliding rail of the din rail and make the two second fastening portions 21 of the sliding component 20 top hold the second sliding rail of the din rail, so that the clamping mechanism clamps and is fixed to the din rail.

In summary, it can be seen that the differences between the present invention and the prior art are that no external force is continuously applied to a sliding component to maintain the removal state of the clamping mechanism, and the clamping mechanism does not require additional tools for recovery of the sliding component, so that it is easy to disassemble the clamping mechanism from the din rail or assemble the clamping mechanism to the din rail.

By the aforementioned technology means, the problems in the prior art that it is inconvenient to remove the clamping device from the din rail and it is easy to cause damage to the clamping device can be solved, and the present invention can achieve the technical effect of providing the clamping mechanism for easy disassembly and assembly on the din rail.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A clamping mechanism for a din rail, which is configured to be fixed to the din rail having a first sliding rail and a second sliding rail, the clamping mechanism comprising:
    a base, having two first fastening portions, a plurality of fixing holes, a group of guiding grooves, a first elastic component fixing portion and a limit component fixing hole;
    a sliding component, having two second fastening portions, a second guiding groove, a second elastic component fixing portion and an operating portion, the sliding component being disposed between the group of guiding grooves of the base to make the sliding component slide relative to the base through the group of guiding grooves;
    an elastic component, a first end of the elastic component being fixed to the first elastic component fixing portion of the base, and a second end of the elastic component being fixed to the second elastic component fixing portion of the sliding component, the elastic component providing a force for the sliding component to slide upward or downward to cause the clamping mechanism to clamp the din rail or be detached from the din rail through the two first fastening portions of the base and the two second fastening portions of the sliding component; and
    a limit component, configured to be fixed by passing through the limit component fixing hole of the base and the second guiding groove of the sliding component, and the limit component providing a limit on a sliding position where the sliding component slides relative to the base to limit a sliding range of the sliding component by the second guiding groove.

2. The clamping mechanism according to claim 1, wherein when the sliding component slides downward from a top end of the group of guiding grooves to make the first end and the second end of the elastic component present at an angle of 90 degrees, the elastic component provides the force for the sliding component to slide upward to make the two first fastening portions of the base fasten the first slide rail of the din rail and make the two second fastening portions of the sliding component top hold the second slide rail of the din rail, so that the clamping mechanism clamps and is fixed to the din rail.

3. The clamping mechanism according to claim 2, wherein when the sliding component slides downward from the first end and the second end of the elastic component at an angle of 90 degrees to a bottom end of the group of guiding grooves, the elastic component provides the force for the sliding component to slide downward to make the clamping mechanism detached from the din rail through the two first fastening portions of the base and the two second fastening portions of the sliding component.

4. The clamping mechanism according to claim 1, wherein when the sliding component slides upward from a bottom end of the group of guiding grooves to make the first end and the second end of the elastic component present at an angle of 90 degrees, the elastic component provides the force for the sliding component to slide downward to make the clamping mechanism detached from the din rail through the two first fastening portions of the base and the two second fastening portions of the sliding component.

5. The clamping mechanism according to claim 4, wherein when the sliding component slides upward from the first end and the second end of the elastic component at an angle of 90 degrees to a top end of the group of guiding grooves, the elastic component provides the force for the sliding component to slide upward to make the two first fastening portions of the base fasten the first slide rail of the din rail and make the two second fastening portions of the sliding component top hold the second slide rail of the din rail, so that the clamping mechanism clamps and is fixed to the din rail.

6. The clamping mechanism according to claim 1, wherein when the sliding component is located at a top end or a bottom end of the group of guiding grooves, the first end and the second end of the elastic component are at an angle of 150 degrees.

7. The clamping mechanism according to claim 1, wherein the operating portion of the sliding component is disposed at a bottom end of the sliding component, and the operating portion is configured to be provided with an external force to make the sliding component slide relative to the base.

8. The clamping mechanism according to claim 1, wherein the elastic component is a torsion spring.

9. The clamping mechanism according to claim 1, wherein the plurality of fixing holes is not disposed between the group of guiding grooves.

* * * * *